United States Patent

Montgomery et al.

[11] Patent Number: 5,904,772
[45] Date of Patent: May 18, 1999

[54] DEVICE FOR ISOLATION OF SEED CRYSTALS DURING PROCESSING OF SOLUTION

[75] Inventors: Kenneth E. Montgomery, Tracy; Natalia P. Zaitseva; James J. Deyoreo, both of Livermore; Russell L. Vital, Tracy, all of Calif.

[73] Assignee: The Regents of the University of California, Oakland, Calif.

[21] Appl. No.: 08/914,844

[22] Filed: Aug. 18, 1997

[51] Int. Cl.[6] .................................................. C30B 35/00
[52] U.S. Cl. .............................. 117/206; 17/204; 17/900
[58] Field of Search ................................. 117/200, 204, 117/206, 208, 900, 911

[56] References Cited

FOREIGN PATENT DOCUMENTS

| 401224292 | 9/1989 | Japan | 117/911 |
| 406048889 | 2/1994 | Japan | 117/911 |

*Primary Examiner*—Felisa C. Hiteshew
*Attorney, Agent, or Firm*—L. E. Carnahan

[57] ABSTRACT

A device for isolation of see crystals during processing of solutions. The device enables a seed crystal to be introduced into the solution without exposing the solution to contaminants or to sources of drying and cooling. The device constitutes a seed protector which allows the seed to be present in the growth solution during filtration and overheating operations while at the same time preventing the seed from being dissolved by the under saturated solution. When the solution processing has been completed and the solution cooled to near the saturation point, the seed protector is opened, exposing the seed to the solution and allowing growth to begin.

19 Claims, 2 Drawing Sheets

DEVICE FOR ISOLATION OF SEED CRYSTALS DURING PROCESSING OF SOLUTION

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the growth of crystals from solutions, particularly to the isolation of seed crystals during processing of the crystal growth solution, and more particularly to a seed crystal protector which allows the seed to be present in the growth solution during processing thereof while preventing damage and dissolution to the seed.

In any method of solution crystal growth, the growth solutions must be filtered and overheated above the saturation point in order to remove all extraneous particles and dissolve crystal clusters which can become crystallization sources during growth of a single crystal. After these operations the seed crystal is introduced into the clean solution. This has been done in two different ways: 1) by introducing a seed fixed on a crystal holder into the tank which contains the processed solution, or 2) by introducing the solution into a tank which contains the seed.

In both of the above-referenced cases the cleanliness and stability of the solution obtained during filtration and overheating are reduced. New extraneous and crystalline particles come from the air, the crystal holder, walls of a dry tank, etc., and small crystalline clusters are formed due to local drying and cooling.

In addition, the seed itself has to be introduced at a temperature higher than the saturation point in order to dissolve crystalline particles which always exist on its surface. The higher the temperature the greater the probability of dissolving all crystalline particles. But at the same time the seed itself will be partially dissolved or even lost during this overheating operation, especially if a small seed is used in a large volume of solution as is often the case during the growth of large crystals, such as the KDP crystals for nonlinear optical devices, such as Pockel cells and frequency converters, weighing up to 3.5 kg.

Various crystal growing techniques have been developed to provide rapid growth of the crystals. These prior approaches are exemplified by N. P. Zaitseva et al., Study Of Rapid Growth Of KDP Crystals By Temperature Lowering, Kristallografiya, 36, 198–202, Jan. 1991; and J. Zachova et al., Application Of High Rate Crystal Growth Technique To Nucleic Acid Bases Single Crystals, SPIE, Vol. 1402, 216–222, 1990.

While these prior processes have greatly advanced the solution crystal growth technology, there is a need for protecting the seed crystal during processing of the growth solution and preventing contamination of the growth solution. This need is satisfied by the present invention which basically involves a seed protector which isolates the seed crystal during processing of the growth solution without removing the seed crystal from the tank containing the growth solution. The protector device basically involves a movable shaft having a sealed cup at one end which surrounds the seed crystal, and upon completion of the solution processing, the shaft is raised to expose the seed crystal to the growth solution.

SUMMARY OF THE INVENTION

It is an object of the present invention to provide a device for the growth of any crystal from solution.

A further object of the invention is to provide isolation of seed crystals during processing of the growth solutions.

A further object of the invention is to provide a device which facilitates the process of loading a seed crystal into the growth solution.

Another object of the invention is to provide a protector for small seed crystals to prevent melting in under saturated solutions.

Another object of the invention is to provide a seed protector which allows the seed to be present in the growth solution during filtration and overheating of the solution while at the same time preventing the seed from being dissolved.

Other objects and advantages of the present invention will become apparent from the following description and accompanying drawings. Basically, the invention involves a device which enables the seed to be introduced into the growth solution without exposing the solution to contaminants or to sources of drying and cooling. The device includes a movable shaft having a sealed, cupped lower end which provides protection for the seed when positioned over the seed, which enables processing of the growth solution, and when the solution processing is completed, the shaft is raised exposing the seed to the solution and allowing growth to begin.

The seed protector is used during the growth of crystals from solutions in order to:

1. sharply increase the stability of solutions against spontaneous nucleation;
2. increase the growth rate of crystals;
3. obtain solutions of high purity to improve the quality of the crystals;
4. control the habit of crystals;
5. facilitate the process of loading a seed crystal into a growth solution; and
6. protect small seeds from melting in under saturated solutions.

The protector device of this invention can be used for the growth of any crystal from solution. It has particular application for fast growth of large KDP crystals of high optical quality, for example, for use in nonlinear optical devices such as Pockels cells and frequency converters used in inertial confinement fusion applications. This device can be used in the growth of any solution based organic or inorganic crystals.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The present invention involves a seed protector for growing crystals in a solution. The seed protector allows the seed to be present in the growth solution during filtration and overheating solution processing operations, while at the same time preventing the seed from being dissolved by the under saturated solution. When the solution processing has been completed and the solution cooled to near the saturation point, the seed protector is opened (raised), exposing the seed to the solution and allowing growth to begin.

The seed protector comprises a platform located in a seed crystal growth tank or crystallizer, to hold the seed and is attached to a hollow shaft through which a concentric or control shaft is raised and lowered. The control shaft has an inverted cup at the lower end which covers the seed to protect it from the solution. One 0-ring seal is mounted around the central shaft, at the bottom inside edge of the hollow shaft through which the control shaft passes, and the functions to wipe the control shaft clean when it is raised and provides a seal or barrier between the growth tank and a space between the concentric hollow and control shafts. Upon raising the seed protector, this space is backfilled with H$_2$O via a port in the hollow shaft and prevents crystals from growing in this space (above the upper seal assembly). The seed protector is locked into either an up or down position via a locknut assembly at the top of the hollow shaft. When down the inverted cup made of Teflon covers the seed and when up the Teflon seal is exposed to the growth solution in the growth tank. Concentric rotation (60–70 rpm for example) of the entire assembly (seed protector and growth tank) is assured by bearings in pillow block assemblies through which the hollow shaft extends.

Figure 1:
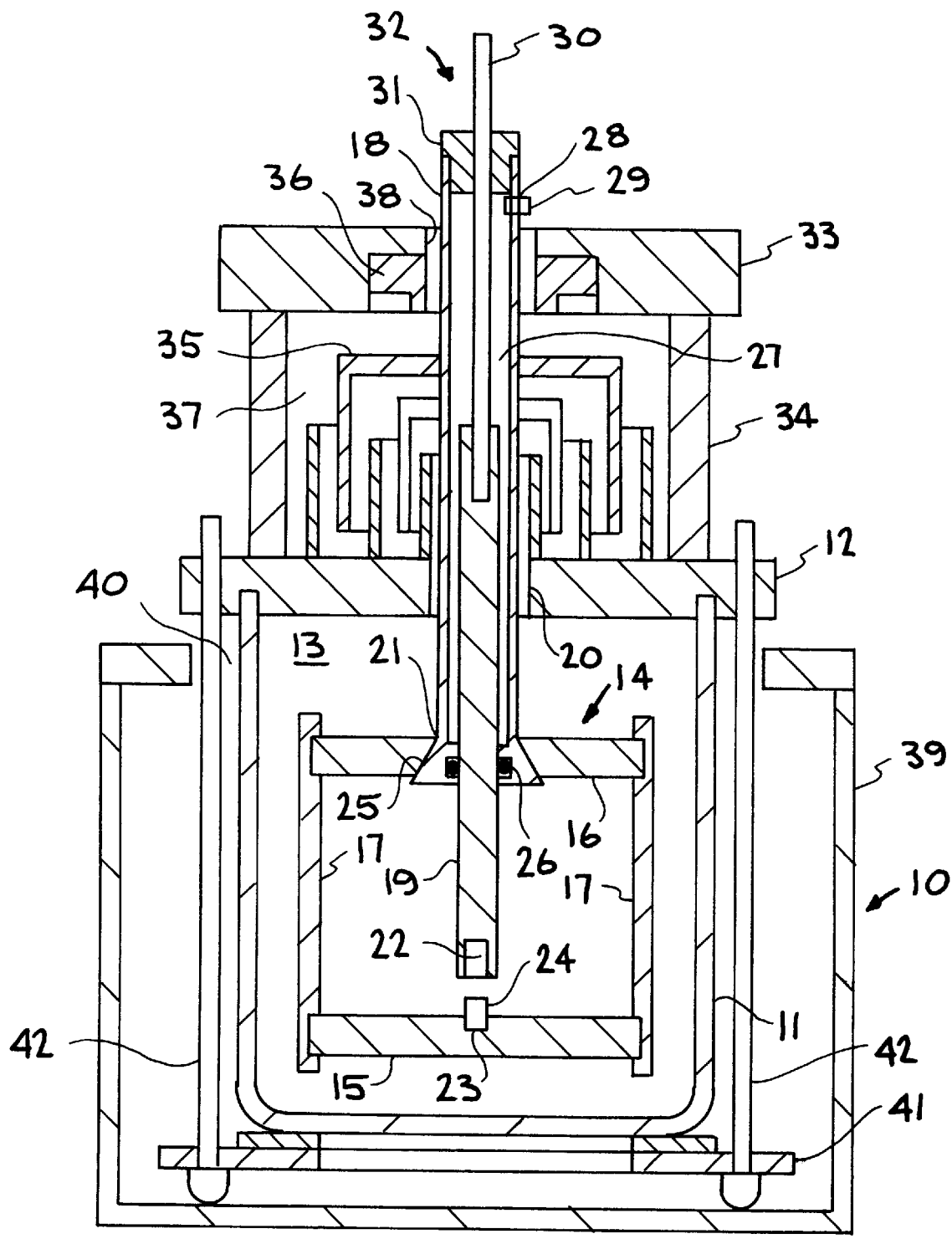
FIG. 1 is a cross-sectional view of a solution crystal growth apparatus which incorporates an embodiment of the protector device of the present invention.

Referring now to the drawing, FIG. 1 illustrates a crystal growth tank or crystallizer within which an embodiment of a seed protector of the present invention is mounted. The crystallizer, generally indicated at 10, comprises a growth tank 11 having a top plate 12 and contains a crystal growth solution 13. A seed protector, generally indicated at 14 is located in tank 11 and includes a platform or lower member 15, an upper member 16, and a plurality (two shown) of support arms 17 which interconnect members 15 and 16. The support arms 17 may be, for example, composed of two or four located on opposite sides or radial edges, or at the corners of the members 15 and 16, if square and are constructed to minimize interference with the crystal growth process.

The seed protector 14 additionally includes a pair of concentric shafts 18 and 19 which extend through an opening 20 in top plate 12 of tank 11 and through an opening 21 in upper member 16. Shaft 18 which is hollow is secured at the lower end in opening 21 of member 16 while solid shaft 19 which includes an inverted cup section 22 at the lower end which is shown slightly raised above platform or lower member 15, which includes an opening 23 in which a crystal seed 24 is located.

A seal assembly 25 having an O-ring 26 is mounted to the end of hollow shaft 18 and/or to the inner surface of upper member 16, with the O-ring extending around solid shaft 19. The seal 26 functions to wipe growth solution from the solid shaft 19 as it passes therethrough and to provide a barrier or seal for a space 27 between shafts 18 and 19. Hollow shaft 18 is provided with an opening 28, closed by a plug 29, through which the space 27 can be filled with H$_2$O, for example, to prevent crystal growth in that space.

Shaft 19 is connected to an extension shaft 30, as by a threaded opening in the top of shaft 19 with the shafts being held at the upper ends via a spacer or collar 31 having a locknut indicated at 32. Extension shaft 30 extends through spacer of collar 31 and is connected to solid shaft 19.

The shafts 18, 19/30 are supported on top plate 12 of tank 11 via a pillow block assembly 33 composed of a frame 34 secured to top plate 12 and in which are positioned a pair of bearing assemblies 35 and 36. Bearing assembly 35 is located in an opening 37 above top plate 12, and bearing assembly 36 is mounted in and opening 38 of frame 34. Concentric rotation of the seed protector 14 and shafts 18 and 19 are assured by the bearing assemblies 35 and 36 of pillow block assembly 33. The various components of the protector device should be constructed to be compatible with the growth solution. The growth tank 10 is mounted in a housing 39 having an opening 40, and is supported at the lower end by a support assembly composed of a support member 41 and a plurality of rods 42 (two shown) secured in top plate 12.

Figure 3:
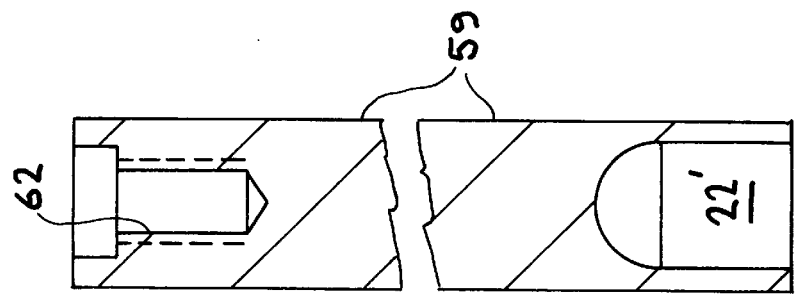
FIG. 3 is an enlarged partial cross-sectional view of the lower protector shaft of the FIG. 2 embodiment.
Figure 2:
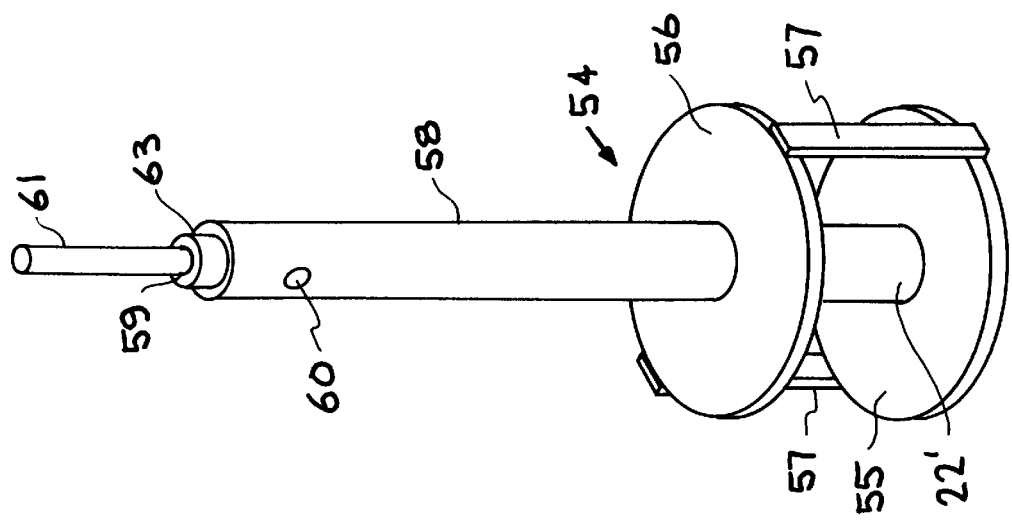
FIG. 2 is a perspective view of another embodiment of the protector device, which may be utilized in the crystal growth apparatus of FIG. 1.

The embodiment of the seed protector illustrated in FIG. 2 differs from that of FIG. 1 primarily in the configuration of the upper member, support arms, and the inverted lower end section of the solid shaft. This embodiment comprises a seed protector 54 having a platform or lower member 55 and an upper member 56 to which support arms 57 are attached at one end and at the opposite end to lower member 55. Only two support arms 57 are shown, but four may be utilized. The seed protector 54, as in the FIG. 1 embodiment utilizes concentric shafts with an outer hollow shaft 58 and an inner solid shaft 59 to which is attached at the upper end to an extension shaft. The lower end of solid shaft 59 is provided with inverted or hollow section 22' (see FIG. 3) which is positioned over a seed as in the FIG. 1 embodiment. The lower member or platform 55 may be constructed as shown in FIG. 1 to hold a seed to be grown. Also, not shown in FIG. 2 are the seal assemblies and such may be constructed as in FIG. 1. Hollow shaft 58 is provided with an opening 60 to fill a space between the shafts 58 and 59, while an extension shaft 61 is secured in a threaded end opening 62 of solid shaft 59, as shown in FIG. 3, and extends through a collar 63 and locknut assembly at the upper ends of the shafts, as in the FIG. 1 embodiment. Shafts 58 and 59 are supported in a bearing assembly as in the FIG. 1 embodiment.

It has thus been shown that the present invention provides a device for isolation and protection of seed crystals during processing of the growth solutions within a growth tank. The protection device is simply constructed and actuated to isolate a seed crystal for the solution during processing and to expose the seed to the growth solution after processing of the solution. The seed protector can be used for the growth of any crystal from a solution, and thus can be utilized in the growth of any solution based organic and inorganic crystals.

While particular embodiments of the invention have been illustrated and described, such are not intended to be limiting. Modifications and changes may become apparent to those skilled in the art, and it is intended that the invention be limited only by the scope of the appended claims.

The invention claimed is:

1. A device for isolating seed crystals during processing of the growth solution, comprising:

a member constructed to hold a seed therein;

means for supporting said member in a crystal growth tank;

a movable shaft having an open section in one end and adapted to extend around a seed crystal and abut with said member; and means for supporting said movable shaft.

2. The device of claim 1, wherein said means for supporting said member includes a second member spaced from and connected to said first mentioned member, and a hollow shaft having one end secured in an opening in said second member.

3. The device of claim 2, wherein said means for supporting said movable shaft includes said hollow shaft, said movable shaft extending through said hollow shaft.

4. The device of claim 3, additionally including a seal assembly positioned around said opening in said second member and around said movable shaft.

5. The device of claim 3, additionally including means connected to said movable shaft and to said hollow shaft for preventing or allowing movement of said movable shaft.

6. The device of claim 3, additionally including an opening in said hollow shaft adapted to enable filling a space between said shafts with a fluid.

7. The device of claim 1, wherein said movable shaft includes a plurality of interconnected sections, one of said sections including said open section in one end thereof.

8. The device of claim 1, wherein said member includes an opening therein for holding a seed crystal.

9. The device of claim 1, in combination with a crystal growth tank having a top plate containing a crystal growth solution, said means for supporting said member includes a bearing assembly mounted on said top plate, said movable shaft extending through said bearing assembly.

10. The device of claim 9, additionally including a frame secured to said top plate, and a second bearing assembly mounted in said frame and aligned with said bearing assembly in said top plate, said movable shaft extending through said second bearing assembly.

11. The device of claim 1, additionally including locking means for said movable shaft for preventing or allowing movement thereof.

12. A crystal seed protector, adapted to be positioned in a crystal growth tank containing a crystal growth solution, comprising:

a platform constructed to retain a seed crystal therein;

movable means adapted to cover a seed crystal located in said platform;

seal means constructed to prevent leakage of an associated growth solution; and means for allowing movement of said movable means for exposing an associated seed crystal to an associated growth solution.

13. The seed protector of claim 12, additionally including a member having an opening therein and spaced from and secured to said platform, said movable means extending through said opening in said member.

14. The seed protector of claim 13, additionally including a pair on concentric shafts, one of said pair of shafts being hollow and having one end thereof secured to said opening of said member, another of said pair of shafts constituting said movable means and extending through said hollow shaft.

15. The seed protector of claim 14, additionally including bearing means positioned adjacent said opening in said member and around said another of said pair of shafts.

16. The seed protector of claim 15, wherein said means for allowing movement of said movable means comprises a locking means operatively connected to said pair of concentric shafts, whereby releasing said locking means allows movement of said movable means.

17. The seed protector of claim 16, additionally including means in said hollow shaft for inserting a fluid into a space between said concentric shafts.

18. The seed protector of claim 14, wherein said another of said pair of concentric shafts comprises a plurality of interconnected sections, one section including an inverted end opening adapted to cover an associated seed crystal, another section being connected to said means for allowing movement of said movable means.

19. The seed protector of claim 12, wherein said platform is constructed to include an opening for retaining an associated seed crystal therein.

* * * * *